United States Patent [19]

Rabinowitz

[11] Patent Number: 4,530,105
[45] Date of Patent: Jul. 16, 1985

[54] LAP COUNTER

[76] Inventor: Jonathan Rabinowitz, 3570 Shannon, Cleveland Heights, Ohio 44118

[21] Appl. No.: 383,973

[22] Filed: Jun. 1, 1982

[51] Int. Cl.³ ..................... G06M 3/06; G06M 1/274
[52] U.S. Cl. ...................................................... 377/12
[58] Field of Search ............... 377/12, 5, 17, 20; 324/208; 272/DIG. 5; 368/110, 111; 33/354, 355

[56] References Cited

U.S. PATENT DOCUMENTS

| | | | |
|---|---|---|---|
| 2,089,914 | 8/1937 | Freeman | 33/363 L |
| 4,013,945 | 3/1977 | Grosso | 324/208 |
| 4,220,996 | 9/1980 | Searcy | 340/323 R |
| 4,371,945 | 2/1983 | Karr et al. | 340/323 R |

FOREIGN PATENT DOCUMENTS

| | | | |
|---|---|---|---|
| 2337435 | 2/1975 | Fed. Rep. of Germany | 351/158 |
| 122290 | 9/1959 | U.S.S.R. | 377/17 |
| 883939 | 11/1981 | U.S.S.R. | 377/19 |

Primary Examiner—Stanley D. Miller
Assistant Examiner—K. Ohralik
Attorney, Agent, or Firm—Browdy and Neimark

[57] ABSTRACT

An automatic lap counting device for use by swimmers and runners, for example, which depends upon the change in the magnetic line of force of the North/South magnetic field for determining the laps.

6 Claims, 4 Drawing Figures

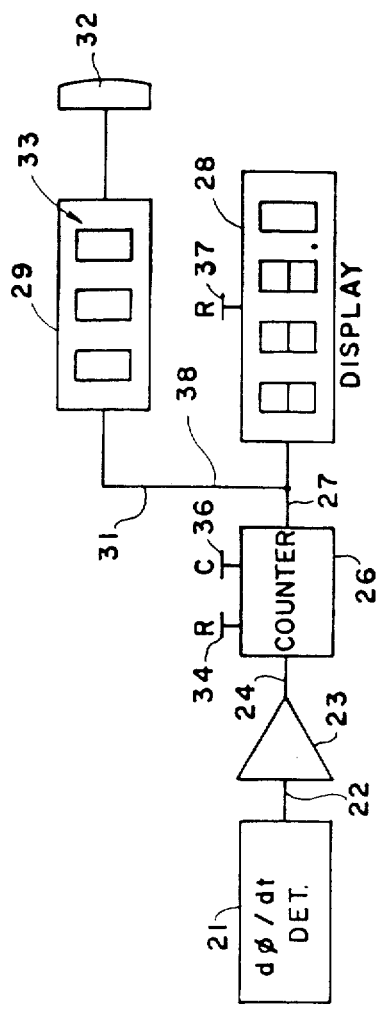
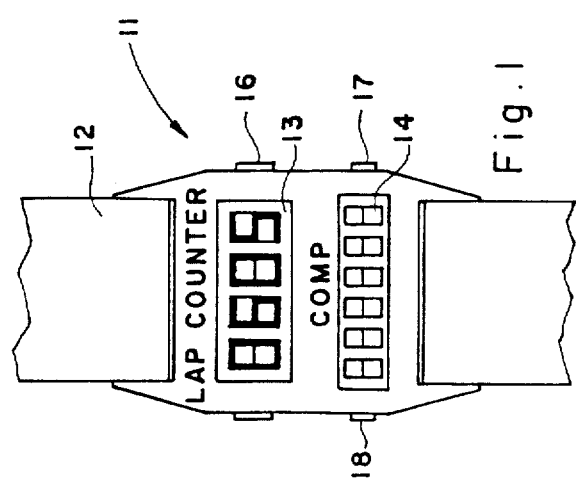
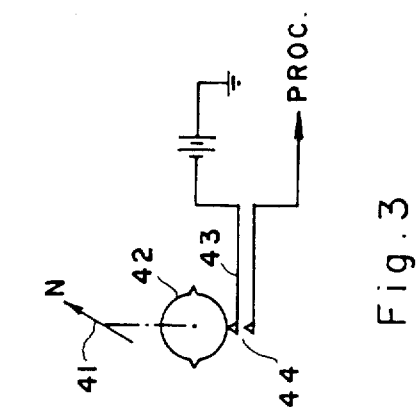
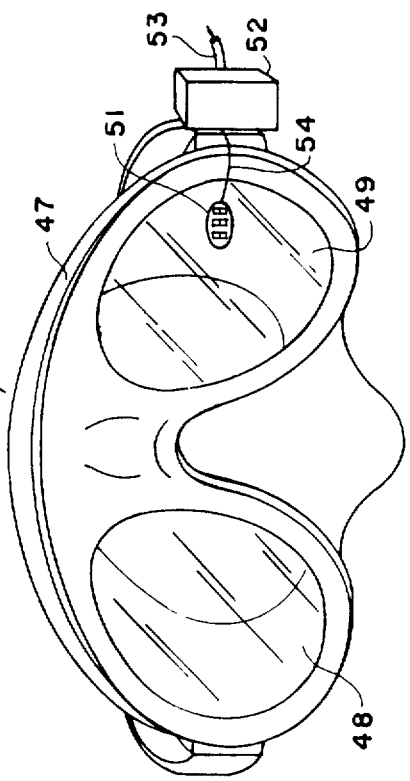

LAP COUNTER

FIELD OF THE INVENTION

This invention is concerned with lap counting devices and more particularly with automatic lap counting devices which do not require actuation by the user.

BACKGROUND OF THE INVENTION

Recently more and more people have been exercising to maintain physical fitness. This may be because more and more people have occupations which may be deemed sedentary and therefore auxiliary exercise is needed to utilize dormant muscles. Two of the more popular exercises are running and swimming. Where the swimming is done in pools and the running is done on tracks the performer usually counts laps. Often he or she sets a certain number of laps as a goal per exercise session or else is interested in knowing how many laps he or she can run or swim in a given amount of time. Very often during the running and/or swimming the performer loses count of the laps. Accordingly various devices have been put on the market to aid the runner and swimmer in counting the number of laps which have been covered. The most popular device of this type is a mechanical counter which is held in the runner's hand where after each lap, the runner actuates a lever that sets a succeeding number on the face of the counter.

These devices work well except that often the runner will forget to actuate the device to provide the sequential count. Additonally it is uncomfortable to have to hold the mechanical counter and do the actuation thereof.

Accordingly there is a long felt need for a reliable automatic counting device which does not require the user to do the actuation for the counting and which does not have to be held in the user's hand.

SUMMARY OF THE INVENTION

Accordingly, it is an object of the present invention to provide new and approved automatic lap counting devices in which the above referred to disadvantages are substantially reduced or overcome. According to the invention an automatic lap counting device is provided. The lap counting device comprises:

means for attaching said device to a user, means for detecting changes of magnetic flux caused by the user's change of directions, means for counting said detected changes of magnetic flux, and means for displaying the counted changes to indicate the number of laps traversed by the user.

A further feature of the present invention is to have means for strapping the automatic counting device to the wrist of the user. Yet another feature of the invention is to have the automatic counting device or the display portion thereof mounted to swimming goggles so to that the swimmer can always determine how many laps he has finished.

Still another feature of the present invention is to provide means for attaching the device to the clothes of the user, such as a runner, so that his hands are unencumbered but still providing the user with a read-out audio or visual whereby the user knows how many laps are finished at all times.

BRIEF DESCRIPTION OF THE DRAWINGS

The operation and the utilization of the present invention will be more fully apparent from the description of a preferred embodiment taken in conjunction with the following drawings, in which:

FIG. 1 is a plan view of a watch-like automatic lap counter for strapping to the user's wrist, FIG. 2 is a block diagram showing of the automatic lap counter, FIG. 3 is a schematic showing of the mechanical mode of detecting the change in magnetic flux caused by the change in direction of the user, and FIG. 4 is a front view showing of swimming goggles with the display device of the automatic lap counter mounted to the goggles.

GENERAL DESCRIPTION

The embodiment of the lap counter device 11 shown in FIG. 1 is provided with means for attachment to the user. These means are shown as the watch band 12 holding the display device 13. As shown in the embodiment of FIG. 1 there is an instantaneous display device 13 which provides the instantaneous lap count and there is also a total display device which provides a total or cumulative display for say a week or so if so desired.

Means are provided for bringing the display devices to zero after use. More particularly reset control 16 zeroes the instantaneous display device.

As shown on display device 13 the reading is 888.5 laps. The 0.5 comes about in that every time the user changes the direction 180° the pulse is generated by the electronic circuitry and accordingly since this normally occurs twice during running a lap the half lap count is available. If the device is used for swimming, for example, then a control is operated to count each 180° turn as a full lap. This control is shown as control 18. Thus every time a person makes a turn he is going in a direction 180° opposite to what he was going prior to the turn. Since the device operates as a consequence of the magnetic direction, a lap in swimming is a turn of 180° while a lap in running is a turn of 360° or two 180° laps.

The block diagram shown in FIG. 2 depicts the circuitry used in the lap counter. Means are provided for detecting change in magnetic flux such as caused by change of direction of the user and for providing a signal responsive to that change of flux. That means is shown as block 21. Any well known flux change detectors can be used, either electronic or mechanical. A mechanical flux change detector is shown for example in FIG. 3.

The output of the flux change detector is connected via conductor 22 to a pulse shaper and amplifier 23. The output of the pulse shaper and amplifier 23 is a pulse which appears on conductor 24 connected to counter 26. The output of the counter 26 is shown as being connected via conductor 27 to visual display device 28. The visual display device typically is an array of LEDs or liquid crystals, for example. The display device as previously mentioned could include a composite display as well as an instantaneous display within the scope of the invention.

Also shown connected to the output of the counter 26 is an audio display circuit shown as display circuit 29 connected to the counter through conductors 31. The output of the audio display circuitry is shown as a speaker or earplug 32. The circuitry 29 while not shown in any detail can be used to operate or select from a series of short tapes which when operated transmit oral numbers, for example, there are a plurality of tapes, having the numbers 0 through 9. The number ten for example would be provided by a 1 and 0. The number hundred would be 1,0,0. The tape deck is shown as, for example, tape decks 33.

The counter is shown as having a reset input 34 and a control input 36. The control input, for example, determines whether the counter counts 180° changes in direction or 360° changes in direction. The display means is also shown as provided with a reset input 37. A switch 39 is shown for selectably switching the audio display unit on or off. Thus for example, on the lap counter of FIG. 1 operating control 16 is used for resetting both the display and the counter. The control 17 is used for providing a signal to the control input 36. The control 18 is used for operating switch 39.

FIG. 3 shows the mechanical mode of detecting the change of magnetic flux due to the change in direction of the user. There is shown a compass needle 41 mounted to and operating a cam plate 42. A cam follower switch contact 43 is operated when the cam turns through 180° responsive to the 180° change in direction by the user wearing the lap counter display device. The cam follower switch c loses switch 44 to complete a circuit from battery to processing equipment such as pulse shaper and amplifier 23 in the circuitry of FIG. 2. There are many available circuits for detecting the change of the earth magnetic flux due to changes in direction, some more complicated and sophisticated than others, but any such device is usable for counting laps within the scope of this invention.

In addition to the audio display it sometimes is beneficial for the user to be able to visually see the display of the laps even while swimming without breaking the swimming rhythm. An embodiment of the device for providing such an opportunity is shown in FIG. 4 as special swimming goggles 46. The swimming goggles are equipped with a rubber gasket 47 therearound and, for example, a pair of separate spectacles 48 and 49. A single glass frame could also be used within the scope of the invention. The lap display is shown at 51 and the circuitry 52 for operating the display is shown mounted onto the head band 53 used for securing the goggles to the user. The circuitry 52 is coupled to the display device 51 through conductors 54. Thus while the swimmer is swimming every time he completes a lap and changes direction the lap counter indicates the lap count. While not shown in the circuitry of the device, it is battery operated. The batteries are not shown but they are connected as is well known to those skilled in the art. Also while not shown, rather than a watch type device strapping onto the wrist there could be a clasp that the user could use to snap onto his shorts or shirt when running laps or swimming.

In use then the user straps the lap counting device either to his wrist or puts on the special goggles or couples the device to his shorts or shirt and checks to be sure that the lap counter is at zero, resets it if it is not at zero and begins to run his laps. If and when the device includes the audio display he puts the ear plug in his ears and starts to run or swim laps. If he is running laps then he presses the proper control to ensure that the pulses counted are every other pulse so that the count is of complete laps and not of half laps. If he is swimming he operates the controls so that every time he changes direction a pulse is counted. Thus if the person using the device is swimming he is apprised at all times of the number of laps he has already completed. He also if desired has an audio display available to him at all times. Thus during his complete exercise cycle he knows how many laps he has finished with certainty which can add to the enjoyment and relaxation provided by the exercise as intended.

While the principles of the invention have been described above in connection with specific apparatus and applications it is to be understood that this description is made by way of example only and not as a limitation on the scope of the invention.

What we claim is:

1. An automatic lap counting device comprising:
   means for attaching said device to a user,
   means for detecting a change of direction of magnetic flux caused by the user's change of direction, relative to magnetic lines of force in the earth's field;
   means for producing a pulse corresponding to said change in direction of magnetic flux,
   means for counting said pulses, and
   means for displaying the counted pulses, the counted pulses correlating proportionally to the number of laps traversed.

2. The automatic lap counting device of claim 1 wherein said means for displaying the counted pulses comprises a liquid crystal display device.

3. The automatic lap counting device of claim 2 wherein said means for attaching said device to the user comprises case means for said display means, said case means being in the form of a watch case, and strap means for attaching said case means to the arm of the user.

4. The automatic lap counting device of claim 1 wherein said means for displaying the counted pulses comprises audio means.

5. The automatic lap counting device of claim 1 wherein said means for attaching said device to a user comprises means for attaching said display means to swimming goggles to enable a swimmer to be apprised of the number of laps traversed.

6. The automatic lap counting device of claim 1 wherein said means for detecting changes of direction of magnetic flux caused by the user's change of direction comprises magnet means, switch means for closing a circuit to actuate said displaying means, and means coupled to said magnet means for operating said switch means responsive to rotating of said magnet means through an angle of more than 180°.

* * * * *